United States Patent
Dohi et al.

(10) Patent No.: US 8,729,491 B2
(45) Date of Patent: May 20, 2014

(54) CHARGED PARTICLE BEAM APPARATUS

(71) Applicant: Hitachi High-Technologies Corporation, Tokyo (JP)

(72) Inventors: Hideto Dohi, Hitachinaka (JP); Akira Ikegami, Hitachinaka (JP); Hideyuki Kazumi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/789,434

(22) Filed: Mar. 7, 2013

(65) Prior Publication Data

US 2014/0021366 A1 Jan. 23, 2014

(30) Foreign Application Priority Data

Jul. 23, 2012 (JP) ................................. 2012-162258

(51) Int. Cl.
- *H01J 37/147* (2006.01)
- *H01J 3/26* (2006.01)
- *H01J 29/58* (2006.01)

(52) U.S. Cl.
USPC ................ 250/396 R; 250/396 ML; 250/306; 250/310; 313/361.1

(58) Field of Classification Search
USPC ....................... 250/396 R, 396 ML, 306, 310; 313/361.1
See application file for complete search history.

(56) References Cited

U.S. PATENT DOCUMENTS

| | | | |
|---|---|---|---|
| 6,452,175 B1 | 9/2002 | Adamec | |
| 6,614,026 B1 | 9/2003 | Adamec | |
| 6,864,482 B2 | 3/2005 | Sato et al. | |
| 7,223,983 B2 | 5/2007 | Kawasaki et al. | |
| 7,355,174 B2 * | 4/2008 | Sato et al. | 250/310 |
| 2011/0272577 A1 * | 11/2011 | Lanio et al. | 250/307 |
| 2012/0006997 A1 * | 1/2012 | Frosien | 250/396 ML |

FOREIGN PATENT DOCUMENTS

| | | |
|---|---|---|
| JP | 2000-348658 A | 12/2000 |
| JP | 2001-015055 A | 1/2001 |
| JP | 2006-012664 A | 1/2006 |
| JP | 2006-054074 A | 2/2006 |
| WO | WO-01/33603 A1 | 5/2001 |

* cited by examiner

*Primary Examiner* — Nikita Wells

(74) *Attorney, Agent, or Firm* — McDermott Will & Emery LLP

(57) ABSTRACT

The present invention provides a charged particle beam apparatus which is provided with a tilting deflector which is disposed between a charged particle source and an objective lens and tilts a charged particle beam, wherein a first optical element includes an electromagnetic quadrupole which generates dispersion to suppress the dispersion which is generated by deflection by the tilting deflector, and a second optical element is composed of a deflector for deflecting the charged particle beam which enters the first optical element or an electromagnetic quadrupole which causes the charged particle beam to generate a dispersion different from the dispersion generated by the first optical element.

7 Claims, 9 Drawing Sheets

CHARGED PARTICLE BEAM APPARATUS

BACKGROUND OF THE INVENTION

The present invention relates to a charged particle beam apparatus such as a scanning electron microscope, and more particularly to a charged particle beam apparatus which tilts and emits a beam with respect to a specimen or to an ideal optical axis of the beam.

An inspection device and a measuring device using an electron beam are demanded to have high precision three-dimensional observation function in order to improve a yield of a three-dimensional device. A method of obtaining an image with a stage inclined has been used for three-dimensional observation using an electron microscope. However, it had problems that the reproducibility of throughput and tilt angle was degraded because mechanical movement was needed to tilt a stage or a column. A method is considered to use a deflector to tilt the beam in order to perform a three-dimensional measurement of the device without inclining the stage.

However, when beam tilt (deflection) is performed by the deflector, a deflection coma aberration and an off-axis chromatic aberration are generated, and beam diameter is increased. To eliminate the deflection coma aberration and the off-axis chromatic aberration which are generated at the time of beam deflection, it is necessary to produce an aberration of the same amount but of opposite sign with respect to the respective aberration generated by the objective lens by another optical element, and the following methods are known.

JP-A-2000-348658 (U.S. Pat. No. 6,452,175) discloses a method that mutually cancels off-axis chromatic aberrations which are generated before and after the lens by a two-stage deflector which is positioned in the objective lens field and deflects the beam in opposite directions.

WO01/33603 (U.S. Pat. No. 6,864,482) discloses a technology in which, when shifting a field of view (image shift) is performed by deflecting the beam, the off-axis chromatic aberration of an arbitrary direction generated at the objective lens when an image shift is performed, is corrected by causing chromatic dispersion by a Wien filter which is arranged on the optical axis on the electron source side away from the objective lens.

JP-A-2001-15055 (U.S. Pat. No. 6,614,026) discloses a method of compensating an off-axis chromatic aberration which is generated when a beam is tilted by causing a chromatic dispersion by an electromagnetic multipole. In addition, it also discloses a method of simultaneously cancelling out the off-axis chromatic aberration and the deflection coma aberration with a hexapole field added to the compensation unit.

JP-A-2006-54074 (U.S. Pat. No. 7,223,983) discloses a method of compensating chromatic aberration and spherical aberration, which are generated when the beam is tilted, by an aberration corrector by tilting the beam without moving an object point of the aberration corrector which is arranged on the electron source side away from the objective lens.

JP-A-2006-12664 (U.S. Pat. No. 7,355,174) discloses a method of adjusting to optical conditions under which off-axis chromatic aberration is made equal to 0 by setting the optical conditions so as to make a positional deviation equal to 0 generated when an excitation current is changed.

SUMMARY OF THE INVENTION

According to the compensation method of JP-A-2000-348658 (U.S. Pat. No. 6,452,175), in order to compensate when the beam is tilted, three sizes of tilt angle, off-axis chromatic aberration amount and deflection coma aberration amount are controlled by (the shape of the objective lens and) the strength of two deflectors arranged in the objective lens. Therefore, if there is another factor, such as the axis deviation or the assembling error of the objective lens, which causes a deviation from the ideal compensation state, it is difficult to comply with varying aberration compensation conditions. Further, it is difficult to separate the tilt angle and the generated aberration from each other.

The technique disclosed in WO01/33603 (U.S. Pat. No. 6,864,482) is a method of correcting an off-axis chromatic aberration which is produced by the objective lens when the beam is tilted by causing a dispersion of the primary electron beam by using an EXB (Wien filter) where an electric field and a magnetic field intersect each other at right angle on a plane perpendicular to the optical axis. Therefore, when a large angle tilting (tilt angle of 10 degrees or more) is performed according to this technique, the deflection coma aberration becomes apparent and the resolution might be degraded.

In addition, according to the technique disclosed in JP-A-2001-15055 (U.S. Pat. No. 6,614,026), it is possible to correct both of the off-axis chromatic aberration and the deflection coma aberration which are generated at the time of beam tilting. To compensate the above two aberrations by this technology, a hexapole field is newly superimposed on the electromagnetic multipole which is disposed to generate a dispersion. Therefore, the compensation unit shape and the number of power supplies for the electrode control increase, and control becomes complex. (For example, the number of poles required for the compensation unit is estimated according to the structure in an embodiment of JP-A-2001-15055 (U.S. Pat. No. 6,614,026). Here, an electromagnetic dipole, an electromagnetic quadrupole and a hexapole field are superimposed, so that the compensation unit needs 12 poles equal to a least common multiple of 2, 4 and 6.)

Further, the technique disclosed in JP-A-2006-54074 (U.S. Pat. No. 7,223,983) shows a method for compensating the aberration generated when the beam is tilted by an on-axis aberration corrector. This system considers beam tilting as an extension of the on-axis aberration and can make the aberration correction in all directions but can not avoid from having a correction unit formed of multiple stages and a multipole.

According to the descriptions of JP-A-2001-15055 (U.S. Pat. No. 6,614,026) and JP-A-2006-54074 (U.S. Pat. No. 7,223,983), the off-axis chromatic aberration and the deflection coma aberration can be compensated but the compensation unit needs hexapole or higher-order pole fields, and complication of control cannot be avoided. Therefore, the optical system structure and its control become complex, and the number of power supplies increase.

The technique disclosed in JP-A-2006-12664 (U.S. Pat. No. 7,355,174) can correct both of off-axis chromatic aberration and deflection, coma aberration, but it cannot occasionally respond to a beam tilting with a relatively large tilt angle.

A charged particle beam apparatus aiming to correct both of the off-axis chromatic aberration and the deflection coma aberration by a relatively simple structure is proposed below.

To achieve the object described above, an embodiment of the invention provides a charged particle beam apparatus comprising an objective lens which focuses a charged particle beam emitted from a charged particle source to impinge a specimen, and a tilting deflector which is disposed between the charged particle source and the objective lens and tilts the charged particle beam, wherein a first optical element includes an electromagnetic quadrupole which causes a dispersion to suppress the dispersion which is generated by the deflection by the tilting deflector, and a second optical element is comprised of a deflector for deflecting the charged particle beam which enters the first optical element or an electromagnetic quadrupole which causes the charged particle beam to generate a dispersion different from the dispersion generated by the first optical element.

According to the above structure, it becomes possible to provide a charged particle beam apparatus having a simple structure which can suppress the off-axis chromatic aberration and the deflection coma aberration.

DETAILED DESCRIPTION OF THE EMBODIMENTS

In this embodiment, an aberration correction unit is configured by combining a pole field of a quadrupole field or less. Specifically, an off-axis chromatic aberration and a deflection coma aberration generated when the beam is tilted are corrected by a deflector (dipole field) and a Wien filter (or a combination of two-stage Wien filters) which has an electromagnetic dipole field and an electromagnetic quadrupole field superimposed. This corrector varies the electromagnetic-field strength of the Wien filter and the excitation amount of the deflector (or strength of the two-stage Wien filter), so that the off-axis chromatic aberration and the deflection coma aberration generated by the corrector can be adjusted. As a result, it becomes easy to adjust at the time of correction.

Figure 1:
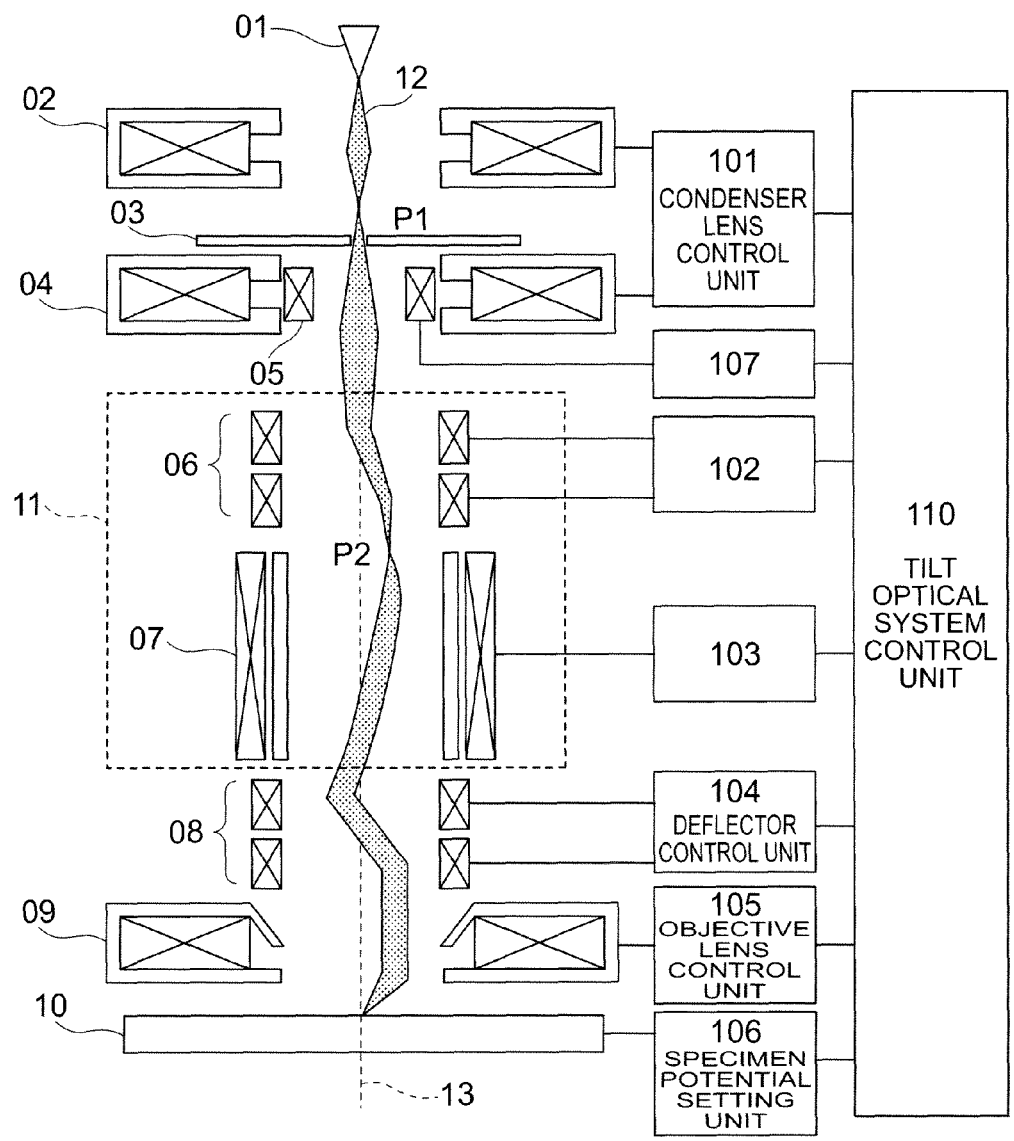
FIG. 1 is a diagram showing a first embodiment of a scanning electron microscope on which an aberration correction unit including a Wien filter is mounted.

A schematic diagram of a beam tilt optical system of a scanning electron microscope is shown in FIG. 1. Primary electrons 12 (electron beam) emitted from an electron source 01 (charged particle source) are converged to a spot P1 by a condenser lens 02. The primary electrons 12 the emission angle of which is limited by an objective aperture 03 are further converged by a condenser lens 04, and enter an aberration correction unit 11. The optical system exemplified in FIG. 1 has a deflector 08 for tilting the beam, which is disposed above an objective lens 09. The electron beam is deflected by the deflector 08 so as to separate from an ideal optical axis (a passing track of the electron beam when the electron beam is not deflected) of the electron beam of the objective lens 09, so that the beam can be emitted at a prescribed relative angle with respect to the ideal optical axis.

The aberration correction unit 11 which comprises a two-stage deflector 06 and an electromagnetic quadrupole (Wien filter 07) is disposed above the deflector 08. The principle is described below along a specific operation method of the aberration correction unit.

The electron beam emitted from the electron source is converged to the spot P1 by the condenser lens 02 and passes through the objective aperture 03. Then it is converged to a spot P2 by the condenser lens 04. The primary electrons converged to the spot P2 enter the aberration correction unit 11 to generate a dispersion and a coma aberration according to the energy width of the electrons Subsequently, the electron beam is corrected by the deflector 08 to a track to impinge the specimen 10 at a desired beam tilt angle, and the beam impinges the specimen 10 at the desired tilt angle. Here, the dispersion and the coma aberration generated by the aberration correction unit 11 are used to correct the off-axis chromatic aberration and the deflection coma aberration generated by the objective lens 09 because the beam is tilted. Operations of the deflector and the Wien filter in the aberration correction unit 11 and the generated aberration are described below.

Figure 2:
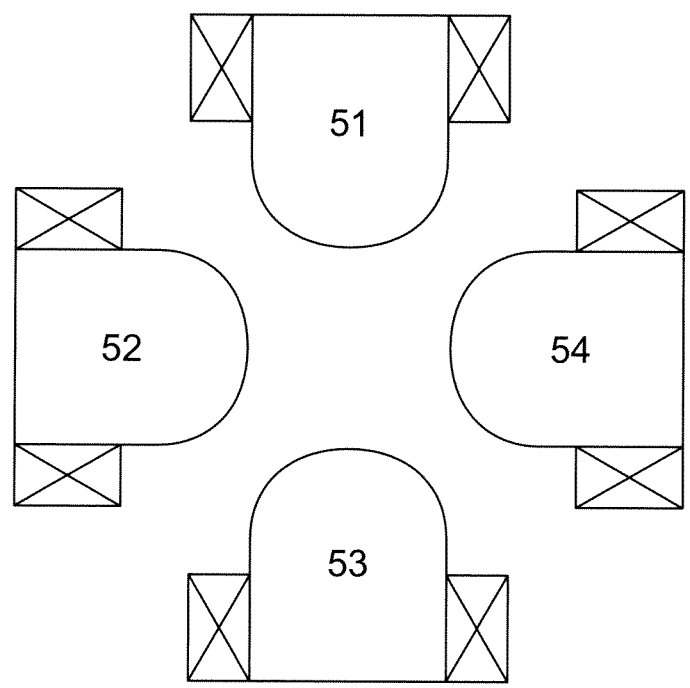
FIG. 2 is a sectional view of the Wien filter.
Figure 3:
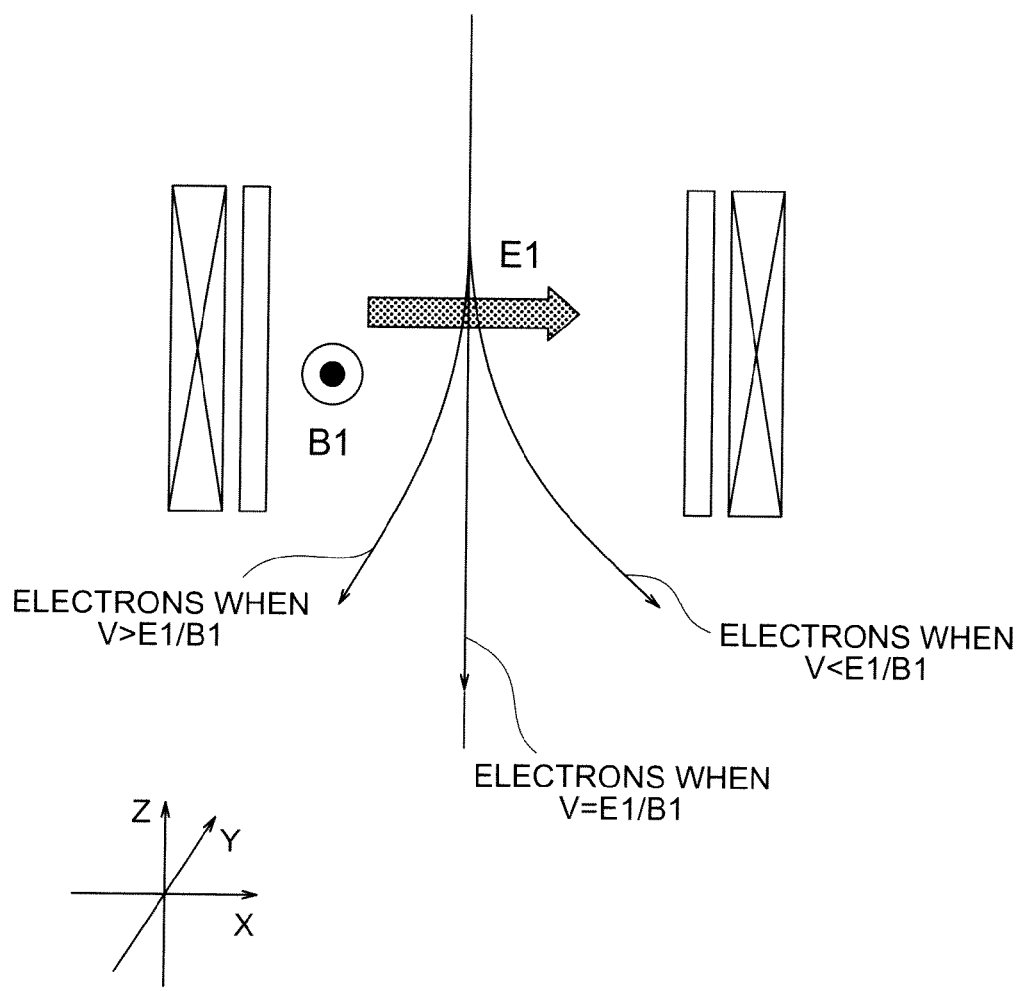
FIG. 3 is an explanatory view of dispersion generated at the time of passage through the Wien filter.

A shape of the Wien filter 07 is shown in FIG. 2. FIG. 2 is a schematic diagram showing that the Wien filter is projected to a cross section perpendicular to an optical axis 13. As shown in FIG. 2, the Wien filter 07 comprises four electromagnetic poles 51, 52, 53 and 54. A coil is wound on each electromagnetic pole, and electrostatic fields E1 and E2 and static magnetic fields B1 and B2 can be generated by applying voltage and current to the electrode and the coil of each electromagnetic pole. Here, E1 (B1) is an electric (magnetic) dipole field, and E2 (B2) is an electric (magnetic) quadrupole field. When the Wien filter operates, a field is generated so that E1 and B1 intersect each other at right angle in a plane perpendicular to the optical axis. In this embodiment, the electric field E1 is taken in the X-axis direction, and the magnetic field B1 in the Y-axis direction. Considered below is a case where the primary electrons 12 pass through the generated electromagnetic fields (E1, B1). The primary electrons 12 are assumed to have a velocity v. The condition under which the primary electrons 12 go straight ahead in the Wien filter is expressed by the following equation.

[MATH. 1]

$$v = E_1(z)/B_1(z) \tag{1}$$

Here, when the primary electrons 12 have low energy ($v<E_1/B_1$), the primary electrons 12 are bent by receiving a deflection action in the direction of the electric field E1, and when the primary electrons 12 have high energy ($v>E_1/B_1$), they are bent toward the opposite direction. As a result, dispersion is generated in the Wien filter. And, a lens action is simultaneously caused in the electric field (X axis) direction. Of the primary electron beam 12 converged in P2 by the lens action caused in the X-axis direction, the component which spreads in the electric field (X axis) direction is subjected to a convergence action, and the component which spreads in a magnetic field (Y axis) direction goes straight ahead. As a result, the convergence point of the X-axis direction and the convergence point of the Y-axis direction are formed at different positions. The difference between the convergence point of the X direction and the convergence point of the Y direction caused as described above can be corrected by superimposing a quadrupole field. The quadrupole field strength which is given to correct the deviation between the X direction focused spot and the Y direction focused spot caused by the lens action of the Wien filter is expressed by the following Equation.

[MATH. 2]

$$\frac{E_2(z)}{E_1(z)} - \frac{B_2(z)}{B_1(z)} = -\frac{eB_1^2}{2mE_1} \quad (2)$$

Here, e is the elementary charge and m is the electron mass. Conditions under which the chromatic aberration generated by the addition of the quadrupole field and given by Equation (2) is made equal to 0 are considered below.

The beam tilt optical system according to this embodiment corrects the off-axis chromatic aberration generated by the objective lens when the beam is tilted by the dispersion generated by the aberration correction unit 11. To generate only dispersion by the aberration correction unit 11, it is necessary to make the chromatic aberration generated by the electromagnetic quadrupole field expressed by Equation (2) equal to 0. Conditions under which the chromatic aberration generated by the electromagnetic quadrupole field is made equal to 0 are expressed by Equation (3).

[MATH. 3]

$$\frac{E_2(z)}{\Phi_0} = \sqrt{\frac{e}{2m\Phi_0}} B_2(z) \quad (3)$$

Equation (1) represents the conditions under which the primary electrons 12 of a particular velocity go straight ahead in the Wien filter, Equation (2) represents the conditions of the quadrupole field strengths (E2 and B2) applied in order to correct the deviation between the X direction focused spot and the Y direction focused spot caused when dipole fields E1, B1 are added to the Wien filter, and Equation (3) represents a relational expression of the electric quadrupole field E2 and the magnetic quadrupole field B2 to make the chromatic aberration generated when the quadrupole field is applied equal to 0. The electromagnetic field which is superimposed on the Wien filter 07 in the aberration correction unit 11 according to the present invention is determined so as to satisfy Equation (1), Equation (2), and Equation (3).

A method of generating the deflection coma aberration is described below. The aberration correction unit 11 of the beam tilt optical system according to the present invention is provided with the two-stage deflector 06 to correct the deflection coma aberration generated at the time of beam tilt. The primary electrons 12 are subjected to a positional deviation $\Delta r_{p2}$ (an off-axis amount from the ideal optical axis) by the two-stage deflector 06, and enters the Wien filter 07. At this time, a dispersion, a secondary aberration and a third aberration are generated by the Wien filter. The generated aberration is classified into five of dispersion, coma aberration, field curvature aberration, astigmatism, and distortion.

The dispersion can be adjusted by the length in the Z direction and the electromagnetic-field strength of the Wien filter 07, and the coma aberration is adjusted by the off-axis amount given by the two-stage deflector 06. The field curvature aberration is adjusted by an excitation amount of the condenser lens 04, and the astigmatism is adjusted by the quadrupole field strength of the Wien filter 07 or a stigmator 05. Distortion aberration is given with a positional deviation and an angle deviation of the primary electrons 12 which are emitted from the Wien filter, and the positional deviation and the angle deviation of the electrons emitted from the Wien filter 07 are adjusted by the deflector 08. By performing the above operation, the aberrations generated by the aberration correction unit 11 become dispersion and deflection coma aberration only, and the above aberrations can be used to correct the off-axis chromatic aberration and the deflection coma aberration which are generated by the objective lens at the time of beam tilt.

In a case where a dispersion and a coma aberration are generated in the Y-axis direction by this system, the directions of E1, E2, B1 and B2 may be rotated by 90 degrees, and the use of the aberration correction unit according to this system can generate the aberration independently when the beam is tilted in the X-axis direction and the Y-axis direction.

Figure 4:
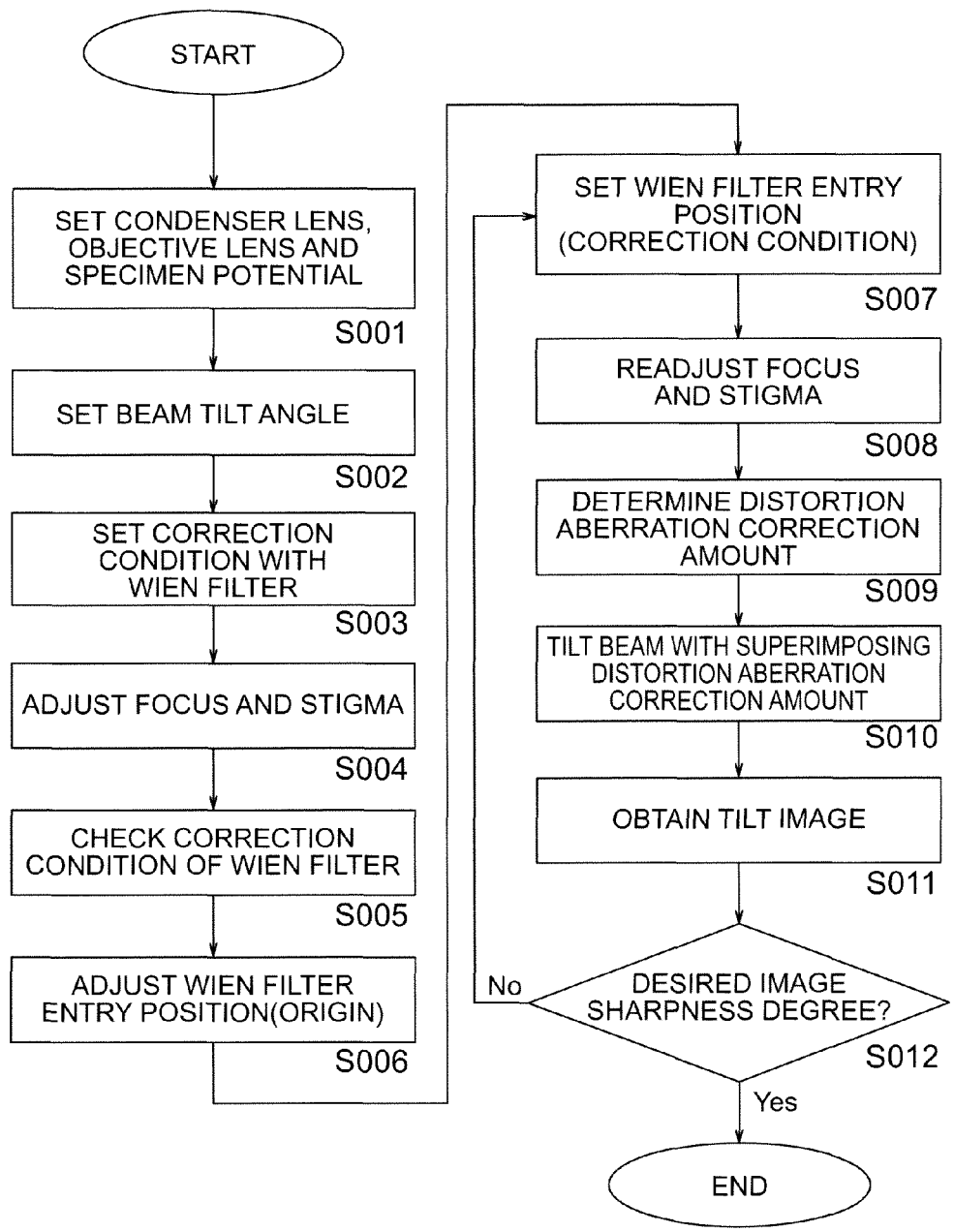
FIG. 4 is a flowchart showing an optical condition setting process when a beam is tilted.
Figure 5:
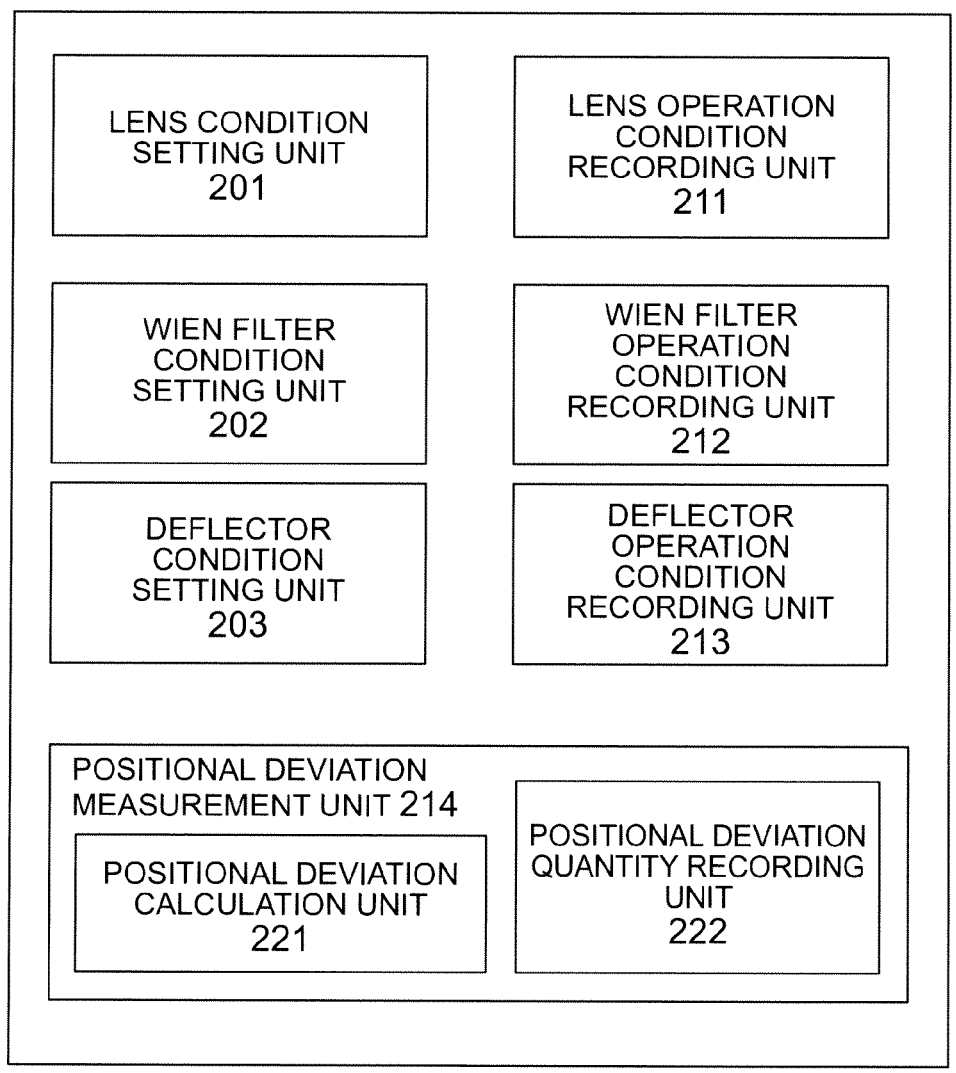
FIG. 5 is an explanatory view of a control unit of a beam tilt optical system.

Embodiments are described in detail below with reference to the drawings. The structure of the first embodiment is shown in FIG. 1, a flowchart is shown in FIG. 4, and details of a tilt optical system control unit 110 are shown in FIG. 5. In Step 001, excitation conditions for each lens and a specimen potential are given to a condenser lens control unit 101, an objective lens control unit 105 and a specimen potential setting unit 106 and set by the tilt optical system control unit 110. (In this embodiment, as an excitation amount of the condenser lens 04, P2 is explained referring to the conditions determined at the Wien filter inlet, but an aberration for correcting can be generated by the aberration correction unit 11 on the same principle even when P2 is set at another place in order to adjust the aperture angle and the current amount.) The tilt angle of the beam is set in Step 002. At this time, current for operating a deflection coil 8 according to the tilt angle is applied by a deflector control unit 104.

In Step 003, conditions to generate a dispersion for correcting the off-axis chromatic aberration which is generated by the objective lens are calculated by a Wien filter condition setting unit 203 based on the set tilt angle and Equation (1) to Equation (3) to determine the values of E1, E2, B1 and B2 to be applied to the Wien filter.

In Step 004, the defocus caused when the electromagnetic field is applied to the Wien filter is adjusted by varying the strength of the condenser lens 04 or the objective lens 09, and the astigmatism is adjusted by varying the quadrupole field strengths of E2 and B2 applied to a stigma coil 05 or the Wien filter 07.

In Step 005, the electromagnetic fields (E1, E2, B1 and B2) applied to the Wien filter are adjusted to minimize the positional deviation of the obtained image when the method disclosed in JP-A-2006-12664 (U.S. Pat. No. 7,355,174) or the voltage of the electron source 01 was varied. Thus, the conditions under which the sum of the off-axis chromatic aberration generated by the objective lens and the dispersion generated by the Wien filter becomes 0 are confirmed. After confirming, the conditions of the applied electromagnetic field of the set Wien filter are stored in a Wien filter operation condition recording unit 212.

In Step 006, an exciting current of the same amount but of opposite sign is given to upper and lower deflectors of the two-stage deflector 06 to make parallel movement of the electron beam 12, thereby defining the origin of the deviation of the Wien filter entry position $\Delta r_{p2}$. When the deviation of the Wien filter entry position $\Delta r_{p2}$ is given, a geometric aberration, a field curvature, an astigmatism, a coma aberration, and a distortion aberration are generated according to the $\Delta r_{p2}$ in the Wien filter. Here, the origin of the $\Delta r_{p2}$ is desired to be at the center of the quadrupole fields (E2 and B2) applied to the Wien filter 07, and the center of the quadrupole field is defined as a position where the positional deviation becomes 0 when the strengths of E2 and B2 are varied so as to satisfy Equation (3). The excitation condition of the deflector 06 under the conditions that the positional deviation is defined to 0 is stored in a deflector operation condition recording unit 213.

In Step 007, a $\Delta r_{p2}$ is newly given on the basis of the $\Delta r_{p2}$ which was set in Step 006. As a result, a geometric aberration, a field curvature, an astigmatism, a coma aberration and a distortion aberration corresponding to the $\Delta r_{p2}$ are generated in the Wien filter. The excitation condition for giving the newly given $\Delta r_{p2}$ is stored in the deflector operation condition recording unit 213.

In Step 008, the image surface aberration and the astigmatism generated in Step 007 are adjusted by using the lens strength of the condenser lens 04 and the stigma coil 05. After adjusting, the setting values of the lens and the stigma coil are stored in a lens operation condition recording unit 211.

In Step 009, distortion aberration generated in the aberration correction unit 11 is corrected by the two-stage deflector 08. Details of the correction method are described in a second embodiment. In Step 010, the beam is tilted with superimposing the correction amount of the distortion aberration determined in Step 009 on the deflection coil 08. In Step 011, an SEM image when the beam was tilted is obtained.

In Step 012, a tilt image of the beam is obtained, and it is judged if a desired sharpness degree was obtained from the sharpness degree of the image. If the desired sharpness degree was not obtained, the process returns to Step 007 to give a new $\Delta r_{p2}$.

In this embodiment, the operation condition stored in the operation condition recording units (211, 212 and 213) are used when the beam is tilted, so that the adjustment procedure performed when the beam is tilted can be made simple.

Figure 6:
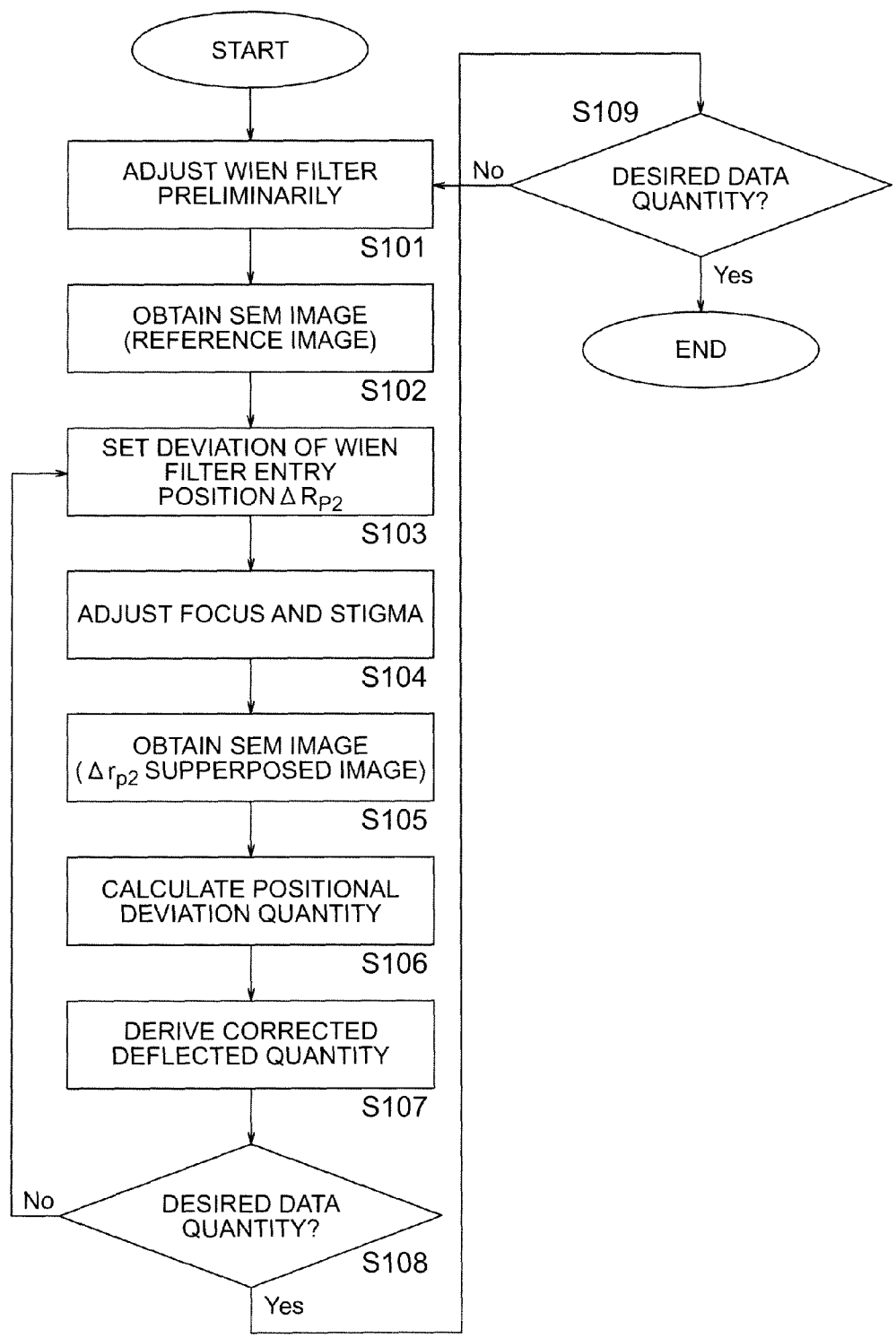
FIG. 6 is a flowchart showing a distortion correcting process.

As the second embodiment, a method of correcting the distortion aberration generated by the correction unit is described. A flowchart of this embodiment is shown in FIG. 6. In Step 101, the Wien filter is preliminarily adjusted. Specifically, the procedure shown in Step 006 of the first embodiment is used, and as to the center of the quadrupole field, the $\Delta r_{p2}$ is set so that the positional deviation becomes 0 when strengths of E2 and B2 are varied so as to satisfy Equation (3). In addition, the incidence angle is adjusted, so that the deviation of the primary electron arrival point is made equal to 0 between the cases that electromagnetic field is not applied to the Wien filter and electromagnetic field is applied to the Wien filter, and the operation condition of the Wien filter after adjusting and the operation condition for the deflector 06 are recorded in the Wien filter operation condition recording unit 212 and the deflector operation condition recording unit 213.

In Step 102, an SEM image representing a reference of the arrival point of the primary electrons 12 is obtained. In Step 103, the deviation of the Wien filter entry position $\Delta r_{p2}$ is given to the deflector 06. In Step 104, the field curvature caused when the $\Delta r_{p2}$ is given is adjusted by varying the lens strength of the condenser lens 04 (or the objective lens 09), the astigmatism is adjusted by varying the strength of the stigma coil 05, and the condition after adjusting is stored in the lens operation condition recording unit 211.

in Step 105, an SEM image when the deflector $\Delta r_{p2}$ is given is obtained. In Step 106, a positional deviation quantity from the reference image obtained in Step 102 is calculated by a positional deviation calculation unit 221 in the distortion aberration measuring unit, and the positional deviation, quantity which is generated when the $\Delta r_{p2}$ is given by the deflector 06 is recorded in a positional deviation quantity recording unit 222. In Step 107, to correct the positional deviation quantity which is in the positional deviation quantity recording unit 222, the excitation amount to be given to the deflector 08 is determined and recorded in the deflector operation condition recording unit 213. In Step 108, the $\Delta r_{p2}$ is varied, and Step 103 to Step 107 are repeated until a desired volume of data is obtained.

In Step 109, Step 101 to Step 108 are repeated until the desired data volume is obtained while the strength of the electromagnetic field which is superimposed on the Wien filter is varied to obtain a lens operation condition, a Wien filter operation condition and a deflector operation condition under respective correction conditions. The aberration correction unit 11 and the deflector 08 are operated along the operation condition obtained in this embodiment, so that a size of the dispersion generated by the aberration correction unit 11 is adjusted by the electromagnetic-field strength applied to the Wien filter 07, and the coma aberration amount generated by the deviation of the entry position $\Delta r_{p2}$ given by the deflector 06 can be adjusted.

By performing the procedure of this embodiment when the SEM main body is adjusted, the parameters of the respective lens and deflector at the time of aberration correction can be formalized to a table. The procedure of setting respective optical parameters when the beam is tilted can be simplified by setting the lens operation condition, the Wien filter operation condition and the deflector operation condition along the correction conditions in the table.

The aberration correction unit 11 described in the above two embodiments has a feature that it controls the generated amount of the dispersion by the electromagnetic-field strength forming the Wien filter 07 and it controls the coma aberration amount by changing the entry position to the Wien filter by the deflector 06. According to this system, the emitting position and the angle of the primary electrons 12 emitted from the aberration correction unit 11 are varied by changing the entry position. Therefore, it is necessary to correct the emitting position and angle change by the deflector 08, and the control becomes complex.

As a third embodiment, description is made on a beam tilt optical system which can simultaneously generate a dispersion and coma aberration when another stage of the Wien filter is added instead of the deflector 06 without giving a change of entry position $\Delta r_{p2}$ to the Wien filter 07.

Figure 7:
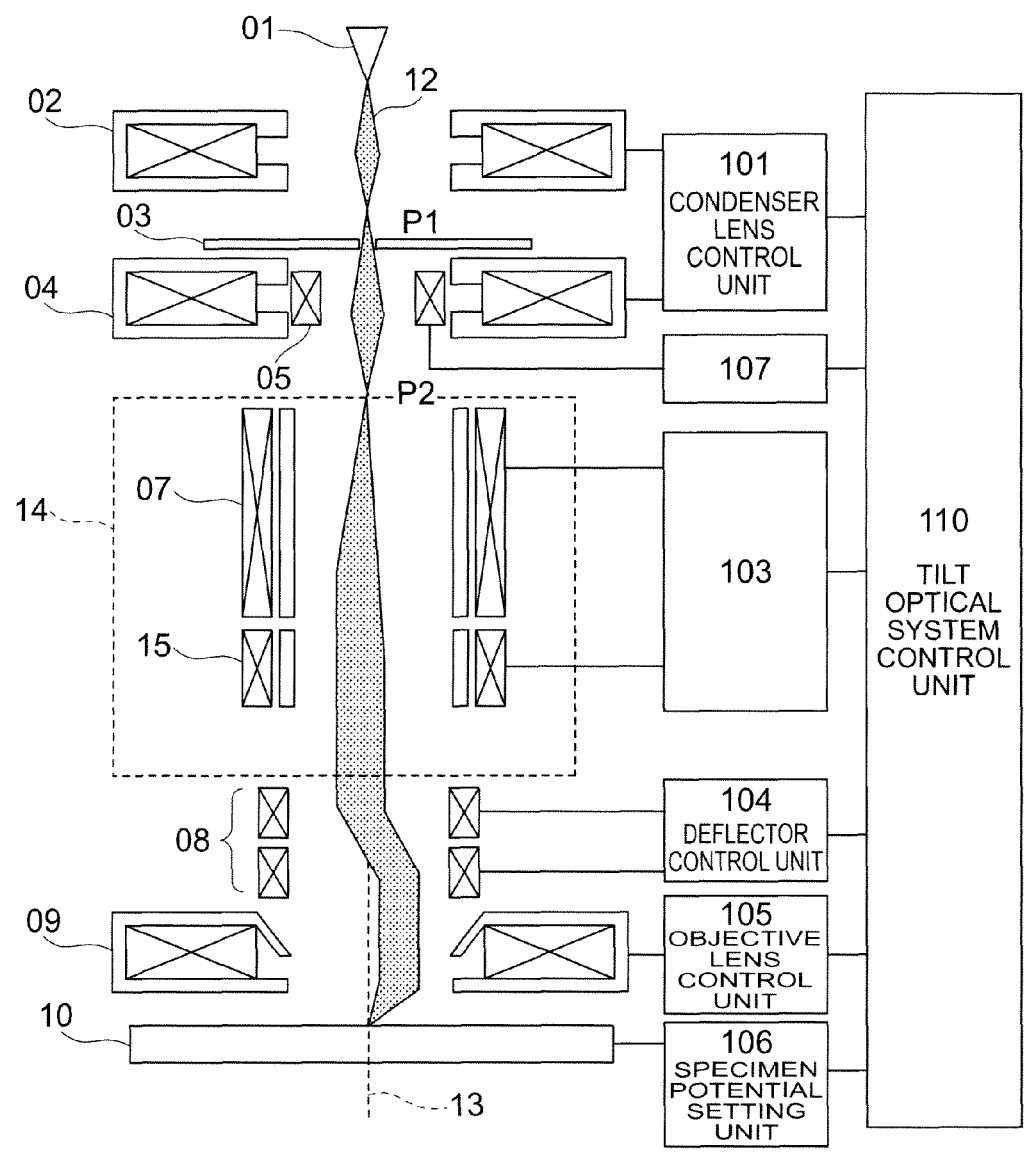
FIG. 7 is a diagram showing a third embodiment of the scanning electron microscope on which the aberration correction unit including the Wien filter is mounted.

FIG. 7 shows a structure diagram of the beam tilt optical system according to this embodiment. The aberration correction unit 11 of the beam tilt optical system shown in the first and second embodiments is comprised of a combination of the deflector and the Wien filter, but an aberration correction unit 14 according to this embodiment has a feature that it is comprised of a two-stage Wien filter.

Features of the aberration correction unit 11 and the aberration correction unit 14 are described. When the primary electrons 12 pass through the Wien filter 07 which is disposed in the aberration correction units (11 and 14), opening components ($\propto \alpha^{*2}$ and $\propto \alpha \alpha^*$) of the secondary aberration are generated together with the dispersion. Such aberration does the same work as the coma aberration does on the specimen surface. Therefore, the aberration correction unit 11 treats the sum of the opening components of the secondary aberration and the coma aberration generated depending on the entry position $\Delta r_{p2}$ to the Wien filter as the coma aberration generated by the aberration correction unit 11, and adjusts the coma aberration amount generated by the aberration unit 11 by controlling the $\Delta r_{p2}$ by the deflector 06. On the other hand, the aberration correction unit 14 described in this embodiment has a feature that (two) Wien filters having different generated amounts of the dispersion and coma aberration are used, and the voltage condition applied to the respective Wien filter is adjusted to adjust the size of the dispersion and coma aberration generated by the aberration correction unit 14.

Here, coma aberration and dispersion adjusting methods are described. When the lens action in the light path is small, the track of the primary electron focused at the object point P2 expands depending on the distance from the object point. As a general characteristic of the Wien filter, a large dispersion and a secondary opening aberration are generated when the Wien filter is disposed in a position where the above-described primary electrons 12 expand largely. And, a ratio (=$\Delta W2/\Delta Wdc$) between the generated dispersion $\Delta Wdc$ and the secondary opening aberration $\Delta W2$ increases according to the expansion of the primary electrons in the Wien filter. Therefore, when the Wien filter is disposed in a place where the primary electrons have a different expansion, an optical element having a difference in the generated dispersion and the secondary aberration is established.

As shown in FIG. 7, this system, is described with reference to an explanatory view of the third embodiment. In FIG. 7, the primary electrons 12 are focused at the top end of the Wien filter 07. At this time, the position of the focused spot is set as P2. The primary electrons 12 focused at P2 expand while receiving the lens action of the Wien filter 07 and enter the Wien filter 15. In the above case, the expansion of the primary electrons 12 is compared in the Wien filter 07 and the Wien filter 15, the expansion of the electrons is larger in the Wien filter 15. Therefore, the ratio (=$\Delta W2/\Delta Wdc$) of aberration generated by the Wien filter 15 becomes larger than the Wien filter 07. Here, the applied electromagnetic-field strength of the Wien filter 15 is adjusted so as to cancel the secondary opening aberration generated by the Wien filter 07. Since the secondary opening aberration generated by the Wien filter 07 and the secondary opening aberration generated by the Wien filter 15 cancel to each other, the aberration correction unit 14 does not generate a secondary aberration but causes a dispersion only. In the above embodiment, it was described that the operation was performed under the condition that the secondary aberration was not generated by the aberration correction unit 14, but in principle, the dispersion and the secondary opening aberration amount generated by the aberration correction unit 14 can be adjusted by adjusting the electromagnetic-field strength applied to the Wien filter 07 and the Wien filter 15.

Figure 8:
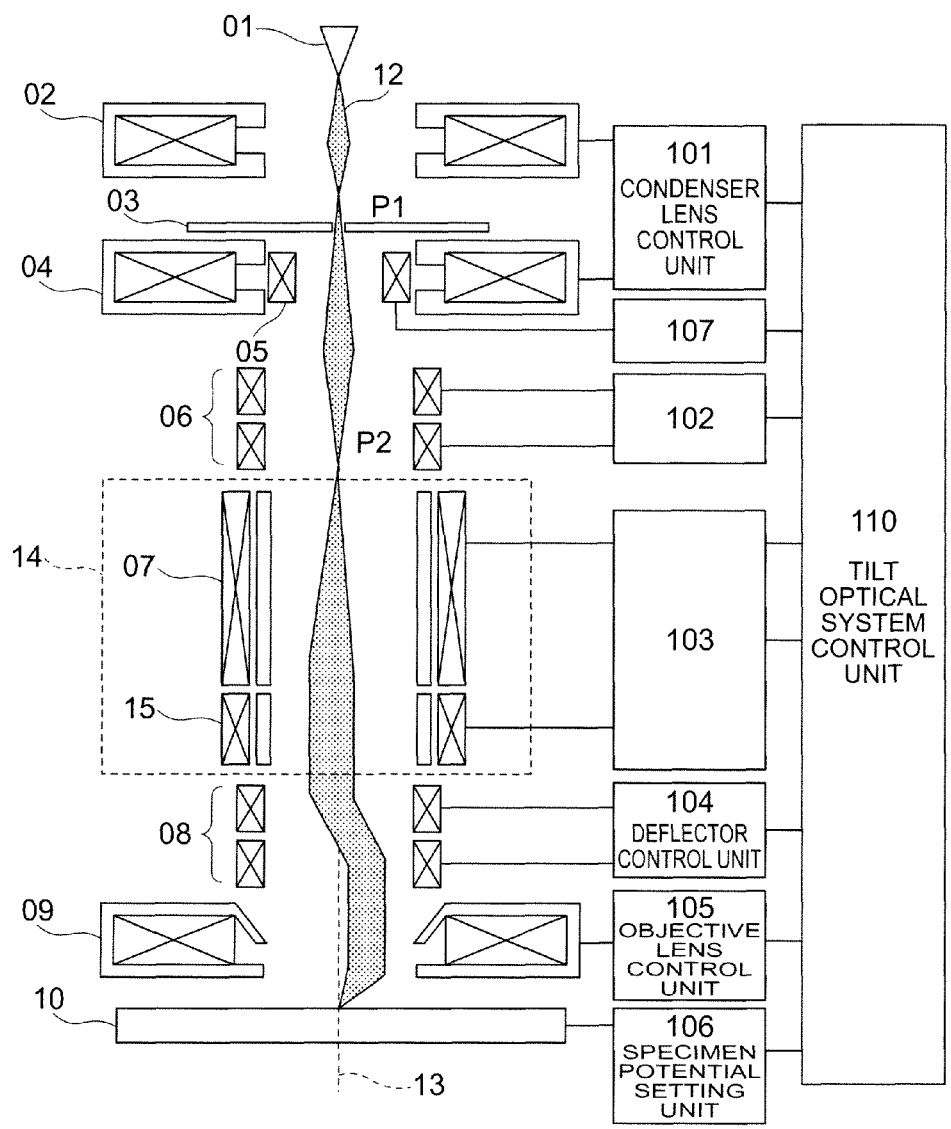
FIG. 8 is a diagram showing a fourth embodiment of the scanning electron microscope on which the aberration correction unit including the Wien filter is mounted.

FIG. 8 shows a schematic diagram of a beam tilt optical system provided with a two-stage deflector 06 for passing the center of the Wien filter as a fourth embodiment. An aberration correction, principle of the beam tilt optical system shown in this embodiment is the same as in the third embodiment, and the dispersion and the secondary opening aberration amount generated by the aberration correction unit 14 can be adjusted by adjusting the electromagnetic-field strength applied to the Wien filter 07 and the Wien filter 15. In addition, the addition of the deflector 06 can make the deviation of the entry position $\Delta r_{p2}$ to the aberration correction unit 14 equal to 0. As a result, the aberration generated by the aberration correction unit 14 becomes only the dispersion and the coma aberration, so that it is possible to solve the problem of the positional deviation and angle deviation of the emitted electrons generated when the correction conditions for the aberration generated when the beam is tilted are inputted to the aberration correction unit 14.

Figure 9:
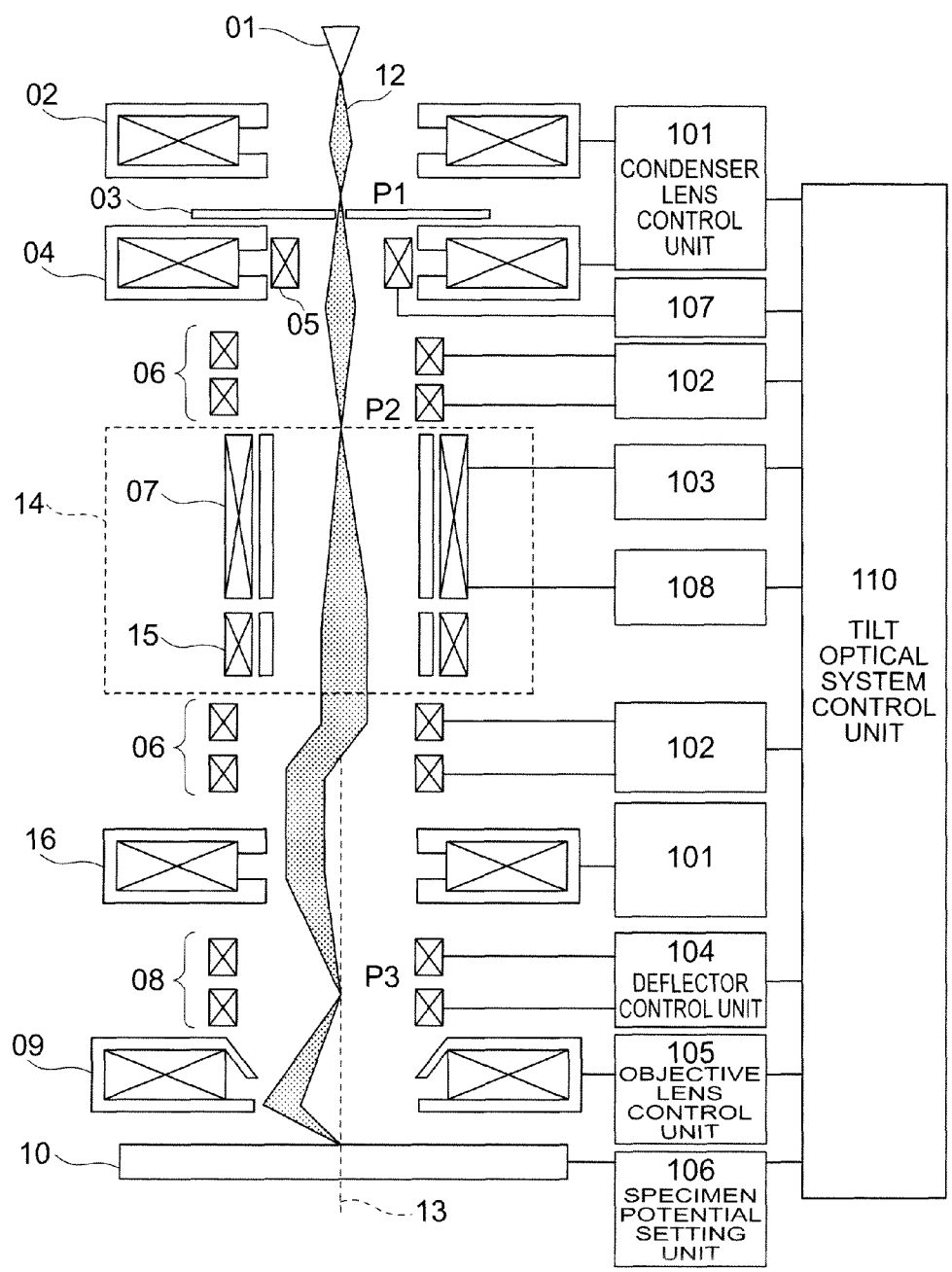
FIG. 9 is a diagram showing a fifth embodiment of the scanning electron microscope on which the aberration correction unit including the Wien filter is mounted.

A fifth embodiment combining plural aberration correction units is described. FIG. 9 shows a schematic diagram of a beam tilt optical system according to the fifth embodiment.

Aberration correction units 11 and 14 of this embodiment have a feature in that the dispersion and the coma aberration generated by the aberration correction units can be varied independently. Therefore, additional application of them to the beam tilt optical system that corrects the off-axis chromatic aberration and the deflection coma aberration by a combination of the lens to be rotated and the deflector, makes it easy to comply with changes in compensation conditions when another factor enters, such as an axis deviation or an assembling error of the objective lens, which deviates from the ideal compensation state.

According to the above embodiment, the off-axis chromatic aberration and the deflection coma aberration generated when the beam is tilted can be corrected by, for example, a combination of the electromagnetic dipole field and the quadrupole field. Since the correction unit has a simple structure, a beam tilted image can be obtained by simple adjustment.

The invention claimed is:

1. A charged particle beam apparatus comprising an objective lens which focuses a charged particle beam emitted from a charged particle source to impinge a specimen, and a tilting deflector which is disposed between the charged particle source and the objective lens and tilts the charged particle beam,
wherein a first optical element comprising an electromagnetic quadrupole which causes a dispersion to suppress a dispersion which is generated by a deflection by the tilting deflector is provided, and a second optical element comprising a deflector which deflects the charged particle beam which enters the first optical element or an electromagnetic quadrupole which causes the charged particle beam to generate a dispersion different from the dispersion generated by the first optical element.

2. The charged particle beam apparatus according to claim 1, wherein the first optical element is a first Wien filter.

3. The charged particle beam apparatus according to claim 2, wherein the first Wien filter is a Wien filter which generates an electromagnetic dipole field and a quadrupole field at a same place.

4. The charged particle beam apparatus according to claim 2, wherein a control unit is provided to control an electromagnetic-field strength which is applied to the first Wien filter when the charged particle beam is tilted by the tilting deflector, a deflector which is disposed above the Wien filter, and an excitation strength with respect to the tilting deflector.

5. The charged particle beam apparatus according to claim 1, wherein the second optical element is a two-stage deflector and deflects the charged particle beam so as to separate the charged particle beam from an ideal optical axis and to enter it into the first optical element.

6. The charged particle beam apparatus according to claim 1, wherein the second optical element is a second Wien filter.

7. The charged particle beam apparatus according to claim 6, wherein the first optical element is a first Wien filter, and a two-stage deflector is disposed above the first Wien filter and the second Wien filter.

* * * * *